United States Patent [19]

King

[11] Patent Number: 6,137,366

[45] Date of Patent: Oct. 24, 2000

[54] HIGH VSWR MISMATCH OUTPUT STAGE

[75] Inventor: Joel R. King, Hillsboro, Oreg.

[73] Assignee: Maxim Integrated Products, Inc., Sunnyvale, Calif.

[21] Appl. No.: 09/056,335

[22] Filed: Apr. 7, 1998

[51] Int. Cl.[7] .............................. H02H 7/20; H03F 3/04
[52] U.S. Cl. ...................... 330/298; 330/207 P; 455/115
[58] Field of Search ................. 330/298, 207 P, 330/284; 455/115; 257/355

[56] References Cited

U.S. PATENT DOCUMENTS

| 3,845,405 | 10/1974 | Leidich .................................. 330/298 |
| 4,729,129 | 3/1988 | Koerner . |
| 4,859,967 | 8/1989 | Swanson . |
| 5,081,425 | 1/1992 | Jackson et al. . |
| 5,357,089 | 10/1994 | Prentice . |
| 5,423,081 | 6/1995 | Thiele et al. . |
| 5,493,255 | 2/1996 | Murtojarvi . |

OTHER PUBLICATIONS

Wong et al., "TP 3.5: A 2.7–5.5V 0.2–1W BiCMOS RF Driver Amplifier IC with Closed–loop Power Control and Biasing," Philips Semiconductors, Sunnyvale, 1998 IEEE International Solid–State Circuits Conference, pp. 52–53.

Maxim Integrated Products, "Low Voltage, Silicon RF Power Amplifier/Predriver," 19–1093: Rev 0; Jul. 1996, pp. 1–8, Sunnyvale, CA, http://www.maxim–ic.com.

Maxim Integrated Products, "MAX2430 Evaluation Kit," pp. 1–4, Sunnyvale, CA, http://www.maxim–ic.com. Dated at Least One Year Prior to Instant Invention.

*Primary Examiner*—Michael B Shingleton
*Attorney, Agent, or Firm*—Hickman Coleman & Hughes, LLP

[57] ABSTRACT

The present invention teaches a variety of high VSWR mismatch output stages and methods for protecting output stages during high VSWR operation. To accomplish these goals, the present invention teaches absorbing reverse base current arising at the base of the power transistor of the output stage. In one embodiment, a variable impedance device such as a transistor is coupled to the base of the power transistor such that when the base-emitter voltage exceeds a predefined voltage, the variable impedance device goes into a low impedance mode and absorbs a portion of the base current. In another embodiment, feedback control circuitry is incorporated into the output stage bias circuitry in order to control the total base current.

22 Claims, 5 Drawing Sheets

HIGH VSWR MISMATCH OUTPUT STAGE

DESCRIPTION

1. Technical Field

The present invention is related to radio frequency (RF) power amplifiers. More specifically, the present invention teaches a variety of high voltage standing wave ratio (VSWR) mismatch output stages for use in RF power amplifiers.

2. Background Art

FIG. 1 illustrates an RF power amplifier 10 of the prior art. The RF power amplifier 10 is well suited for applications such as cellular phones, cordless phones, two way pagers, wireless LANs, and AM and FM analog transmitters. As will be appreciated, depending upon the complexity and/or cost of the system, the RF power amplifier 10 may serve simply as a driver amplifier, or may be the complete power amplifier for the system.

The power amplifier 10 includes a power npn transistor Q1, output bias circuitry 12, an RF driver 14, and a capacitor 16. The npn transistor Q1 has a collector 22 coupled to a terminal labeled RFOUT, a base 24, and an emitter 26 coupled to a common ground reference 30. The RF driver 14 amplifies an RFIN signal and then outputs the amplified signal to the capacitor 16. The capacitor 16 essentially serves to remove any DC component of the amplified output of the RF driver 14, leaving only the AC component to control the transistor Q1.

The output bias circuitry 12 is coupled to the base 24 and injects a substantially constant current $I_{bias}$ into the base 24. The current $I_{bias}$ biases the transistor Q1 into an initial state such that, under "normal" operating conditions, the AC component of the RF signal controls the output current $I_c$ flowing through the collector 22.

As will be appreciated by those skilled in the art of electronics, voltage standing wave ratio (VSWR) is a measure of how close a given impedance is to a system impedance. In communication systems, failure to match impedances causes unwanted standing waves resulting from signal reflection at the load. Accordingly, the general rule for RF power amplifiers is that the impedance seen by the output stage should match the nominal impedance of the load.

However, the impedance of a load such as an antenna 18 varies with motion and position. As a result, the voltage swing across the antenna, and thus the voltage swing at the collector 22, can also vary widely. For example, an RF amplifier driving a cellular phone antenna with 50 ohms nominal impedance may be required to drive an actual impedance having a VSWR as great as 20:1. For reasons described below, an amplifier driving high VSWR load may suffer from serious degradation due to mismatched loads.

Except at low collector-emitter voltages, the safe operating area (SOA) of a bipolar transistor is limited by a phenomenon termed "secondary breakdown." Secondary breakdown restricts the simultaneous collector-emitter voltage $V_{ce}$ and current $I_c$ that may be safely applied to a bipolar transistor. Exceeding the SOA can result in transistor failure.

When $V_{ce}$ is equal to or greater than the collector-emitter breakdown voltage $BV_{ceo}$, the well-known avalanche multiplication mechanism occurring within the transistor generates reverse internal base current; i.e., base current generated by the transistor itself and in the reverse direction of the bias current. At $V_{ce}$ approximately equal to $BV_{ceo}$, the reverse internal base current $I_b$ is sufficient to keep the transistor Q1 on without any external base current $I_b$. At $V_{ce}$ greater than $BV_{ceo}$, the net base current $I_b$ actually reverses. The net reverse base current $I_b$ causes the base-emitter voltage $V_{be}$ to increase which in turn causes the collector current $I_c$ to increase.

Applying these principles to the power amplifier 10 of FIG. 1, it can be seen that variation in the load impedance at RFOUT causes high VSWR mismatch. (VSWR mismatch is simply the ratio of the mismatched VSWR to the normal VSWR.) The high VSWR mismatch results in a large collector-emitter voltage $V_{ce}$ causing reverse base current $I_b$. The reverse base current $I_b$ increases $V_{be}$ which causes an increase in the collector current $I_c$. Thus the high VSWR mismatch results in both a large collector-emitter voltage $V_{ce}$ and a large collector current $I_c$, a recipe for secondary breakdown of the transistor Q1.

What is needed is an output stage capable of absorbing and controlling the base current $I_b$ such that transistor breakdown resulting from high VSWR mismatch does not cause secondary breakdown.

DISCLOSURE OF THE INVENTION

In order to achieve the foregoing and in accordance with the present invention, the following teaches absorbing reverse base current arising at the base of the power transistor of the output stage. In one embodiment, a variable impedance device such as a transistor is coupled to the base of the power transistor such that when the base-emitter voltage exceeds a predefined voltage, the variable impedance device goes into a low impedance mode and absorbs a portion of the base current. In another embodiment, feedback control circuitry is incorporated into the output stage bias circuitry in order to control the total base current.

One particular embodiment of the present invention teaches an output stage suitable for use in a radio frequency (RF) power amplifier. The output stage of this embodiment includes a first transistor and control circuitry that can absorb reverse base current generated at the first transistor. The control circuitry electrically couples the base of the first transistor to a common ground reference through a variable impedance device (e.g., a transistor) and can sense the base-emitter voltage $V_{be}$ and adjust the impedance of the variable impedance device such that a portion of the base current $I_{bQ1}$, is absorbed by the variable impedance device when the base-emitter voltage $V_{be}$ exceeds a certain threshold voltage. This means that the control circuitry tends to prevent secondary breakdown of the first transistor by absorbing the portion of the base current thereby limiting $I_{cQ1}$.

Another embodiment of the present invention teaches a data communication system having an output stage for driving an antenna. The output stages includes a first transistor and control circuitry for electrically coupling the base of the first transistor to a common ground reference. The control circuitry includes a variable impedance device. The control circuitry absorbs reverse base current by sensing the base-emitter voltage $V_{be}$ and adjusting the impedance of the variable impedance device such that a portion of the base current $I_{bQ1}$ is absorbed by the variable impedance device when the base-emitter voltage $V_{be}$ exceeds a certain threshold voltage.

The present invention further teaches an output stage particularly well suited for operating under high voltage standing wave ratio (VSWR) operating conditions The output stage includes a bipolar power transistor and a biasing power supply coupled to the base of the bipolar power transistor. The biasing power supply provides a biasing signal to the bipolar power transistor thereby maintaining the bipolar transistor in a state suitable for control by an RF signal applied to the base of the bipolar power transistor. Furthermore, the biasing power supply includes feedback circuitry operable to adjust the biasing signal to absorb a portion of a base current $I_b$ driving the base of the bipolar power transistor such that the bipolar power transistor is not forced into secondary breakdown.

In a related embodiment, the biasing power supply includes a bias current source $I_{bias}$, a start current source $I_{start}$, and second, third, fourth, and fifth transistors. These elements are coupled as follows. The first terminal of the bias current source $I_{bias}$ the first terminal of the start current source $I_{start}$, and the emitter of the third transistor are coupled to a common power supply. The emitters of the second, fourth, and fifth transistors are each coupled to a common ground reference. The second terminal of the bias current source $I_{bias}$, the collector of the second transistor, and the base of the third transistor are electrically coupled. The base of the bipolar power transistor, the base of the second transistor, the second terminal of the start current source $I_{start}$, and the collector of the fifth transistor are electrically coupled together. Finally, the collector of the third transistor, the collector and the base of the fourth transistor, and the base of the fifth transistor are electrically coupled together.

A separate aspect of the present invention teaches a method for protecting an output stage from secondary transistor breakdown under high voltage standing wave ratio (VSWR) operating conditions. The protected output stage typically has a first power transistor with a collector, a base, and an emitter The method involves performing the acts of sensing a base-emitter voltage $V_{be}$ and absorbing a portion of a base current $I_b$ driving the base of the first transistor in response to the base-emitter voltage $V_{be}$, thereby decreasing the quantity of the base current $I_b$ driving the base of the first transistor. As a result, a collector current $I_c$ flowing through the first transistor that is a function of the base current $I_b$ is decreased due to the decrease in the base current $I_b$ driving the first transistor.

A related method provides that the act of absorbing a portion of a base current $I_b$ includes the act of decreasing an impedance of a variable impedance device coupled between the base of the first transistor and a common ground reference. This may be accomplished through a threshold action only absorbing the portion of the base current $I_b$ when the base-emitter voltage $V_{be}$ is greater than or equal to a certain voltage.

BEST MODES FOR CARRYING OUT THE INVENTION

Figure 1:
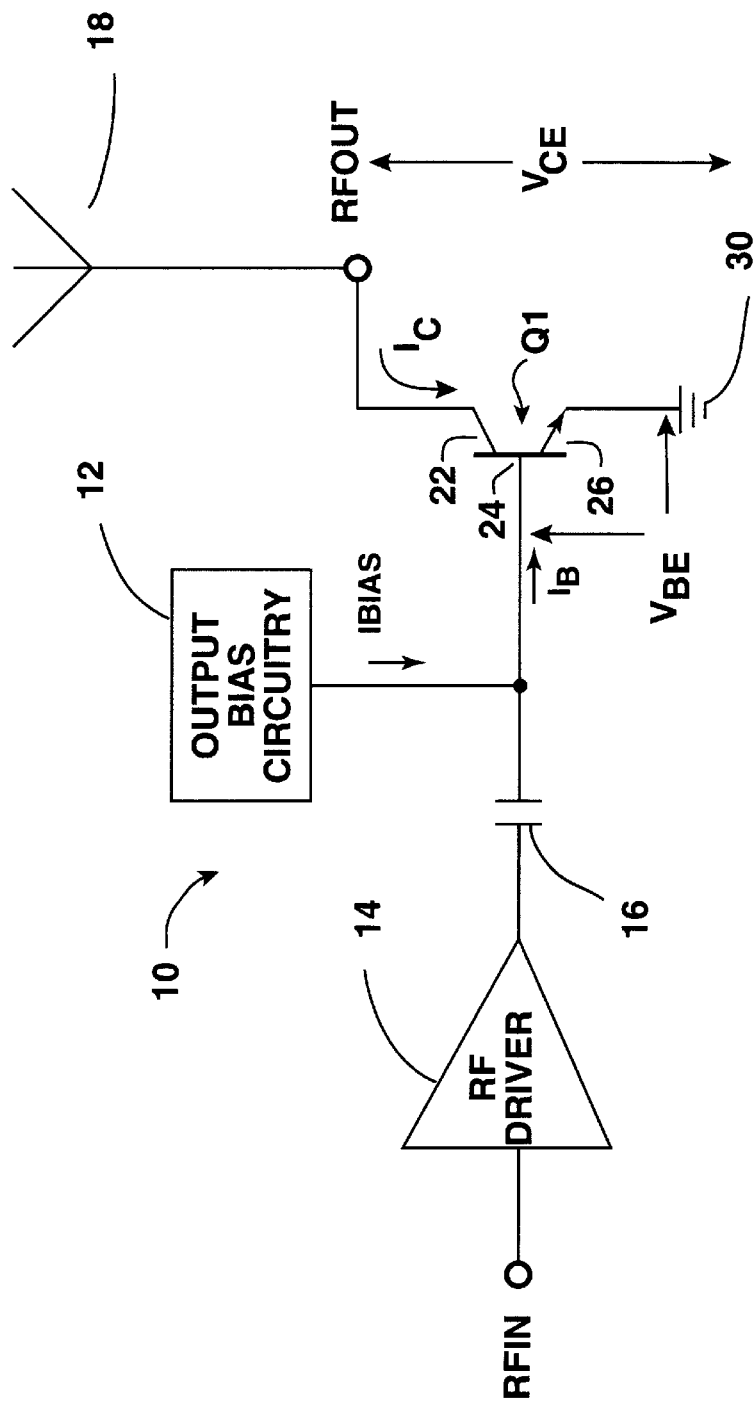
FIG. 1 is a schematic of an RF power amplifier output stage of the prior art.
Figure 2:
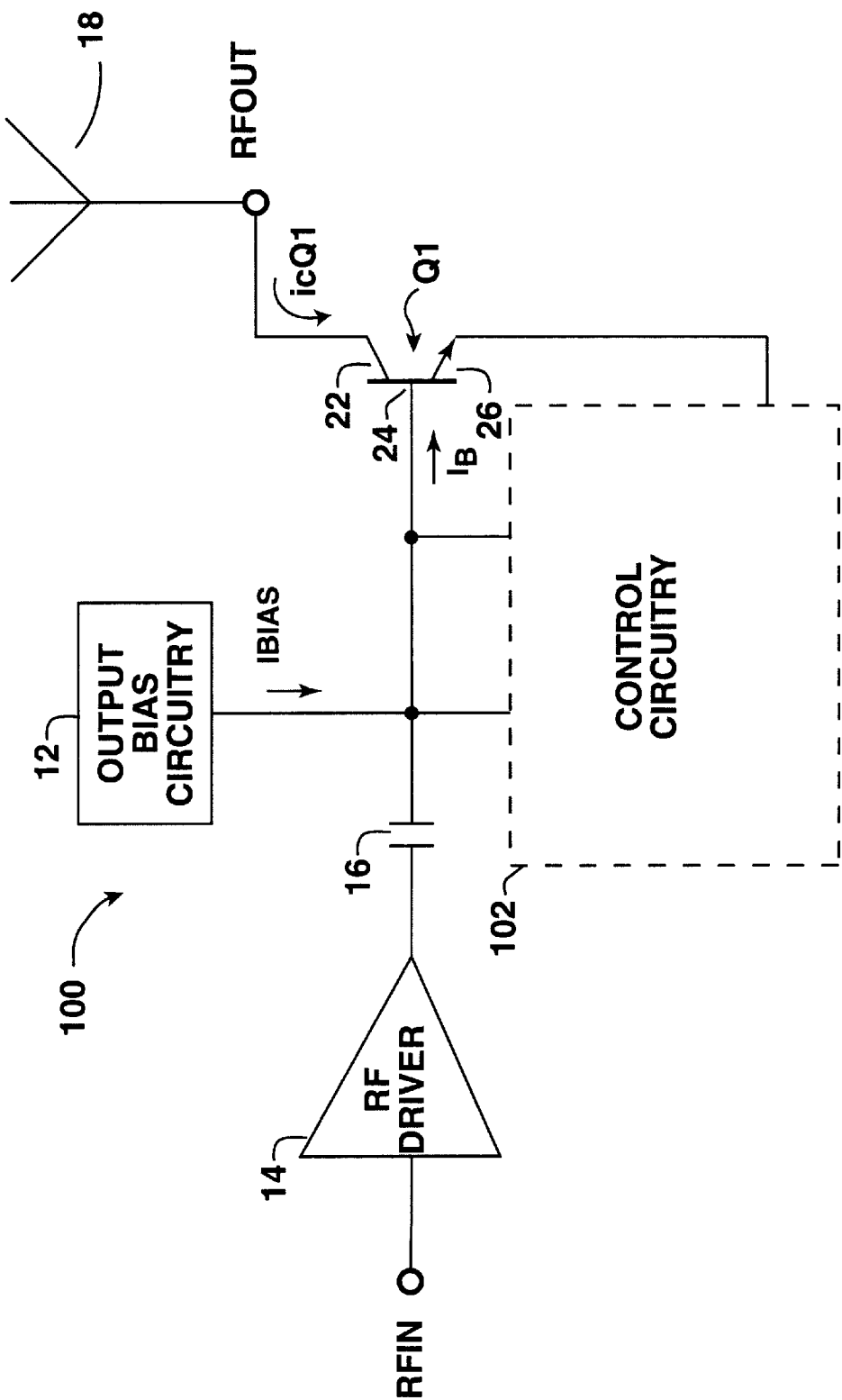
FIG. 2 is a schematic of an RF power amplifier output stage in accordance with one embodiment of the present invention.

With reference to FIG. 2, a power amplifier 100 in accordance with one embodiment of the present invention will now be described. The power amplifier 100 includes a power npn transistor Q1, output bias circuitry 12, an RF driver 14, a capacitor 16, and control circuitry 102. The npn transistor Q1 has a collector 22 coupled to a terminal labeled RFOUT, a base 24, and an emitter 26 coupled to a common ground reference 30. The terminal labeled RFOUT may be coupled to an antenna 18.

The RF driver 14 amplifies an RFIN signal and then outputs the amplified signal to the capacitor 16. The capacitor 16 essentially serves to remove any DC component of the amplified output of the RF driver 14, leaving only the AC component to control the transistor Q1. The output bias circuitry 12 is coupled to the base 24 and injects a substantially constant current $I_{bias}$ into the base 24. The current $I_{bias}$ biases the transistor Q1 into an initial state such that, under "normal" operating conditions, the AC component of the RF signal controls the output current $I_c$ flowing through the collector 22.

According to the present invention, the control circuitry 102 is a variable impedance device having an impedance that varies as a function of the base-emitter voltage $V_{bQ1}$. Specifically, as $V_{bQ1}$ increases, the impedance of the control circuitry 102 should decrease such that an increased amount of the base current $I_b$ is absorbed or redirected away from the base 24. By absorbing a portion of the base current $I_b$, the collector current $I_{cQ1}$ is limited. Hence the control circuitry 102 must sense the base-emitter voltage $V_{bQ1}$ and adjust its impedance accordingly.

Figure 3:
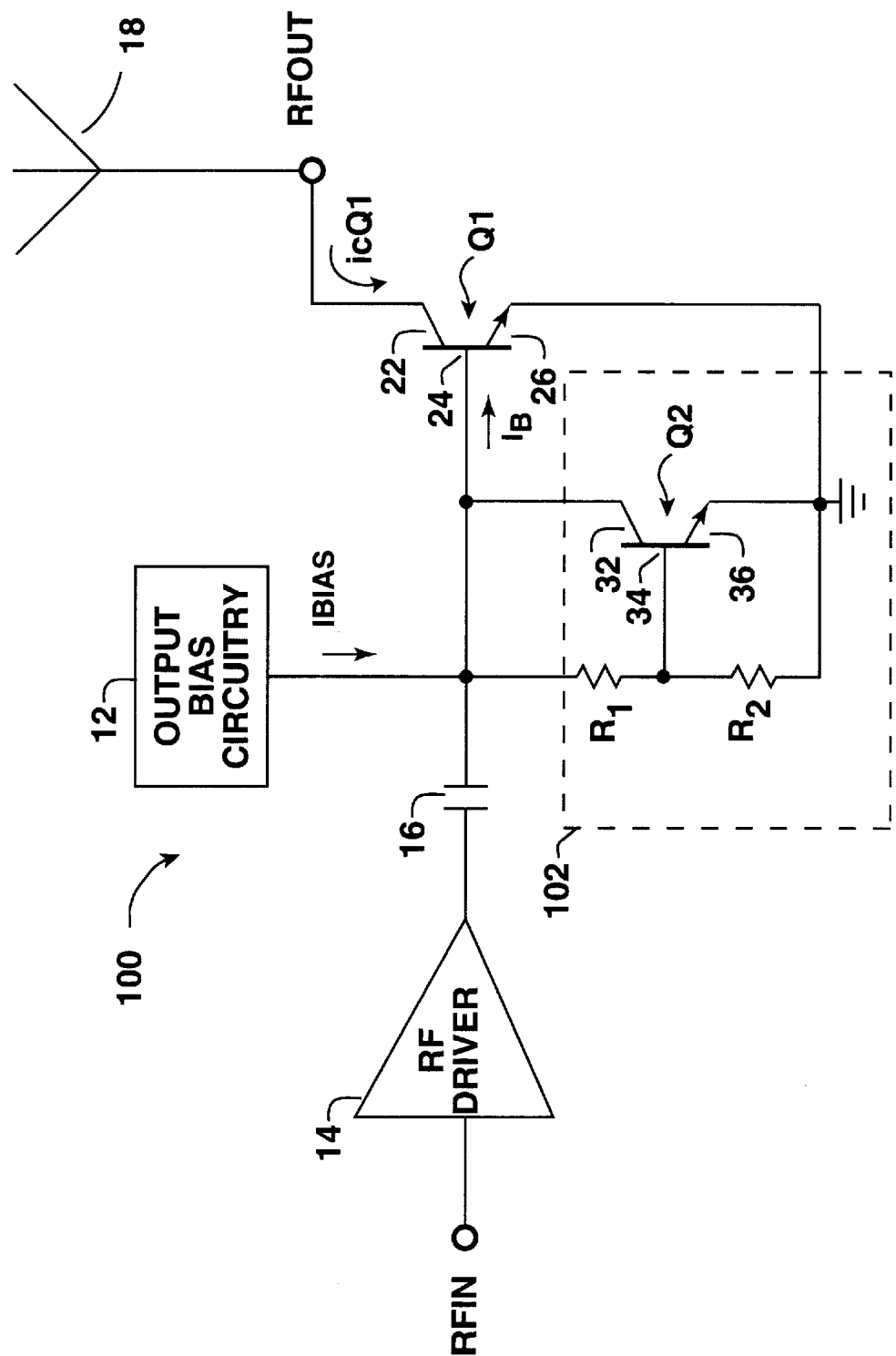
FIG. 3 is a schematic of an RF power amplifier output stage having specific control circuitry in accordance with another embodiment of the present invention.

Turning next to FIG. 3, one preferred embodiment of the control circuitry 102 of FIG. 2 will now be described. The control circuitry 102 of FIG. 3 includes two resistors $R_1$ and $R_2$, and a second npn transistor Q2. The second transistor Q2 has a collector 32, a base 34, and an emitter 36. The two resistors $R_1$ and $R_2$ are coupled in series between the base 24 of the transistor Q1 and ground 30, with the node coupling the two resistors also connected to the base 34 of the second transistor Q2. Hence $R_1$ and $R_2$ form a voltage divider. The collector 32 of the transistor Q2 is coupled to the base 24 of the transistor Q1, and the emitter 36 of the transistor Q2 is coupled to ground 30.

The control circuitry 102 of FIG. 3 produces a low impedance at the base 24 of the transistor Q1 under the following conditions. When the base-emitter voltage $V_{bQ1}$ reaches a certain voltage $V_{bmax}$, defined by $R_1$ and $R_2$, the transistor Q2 is turned on. When transistor Q2 turns on, a portion of the current $I_b$ is absorbed at the collector 32 of the transistor Q2. This limits the collector current $I_{cQ1}$ from increasing beyond a certain maximum at $V_{bmax}$. This prevents destructive secondary breakdown. Note also that reverse base current $I_b$ can cause the base-emitter voltage $V_{bQ1}$ to increase. However, by absorbing base current, Q2 tends to limit $V_{bQ1}$ to $V_{bmax}$.

As will be appreciated, the component values will vary depending upon the particular application. For example, it has been found that $R_1$ equal to about 500 Ohms and $R_2$ equal to about 3000 Ohms would be suitable. Additionally, the circuitry of FIGS. 2 and 3 are preferably packaged on a single integrated circuit, however this is by no means necessary.

As will be appreciated, the control circuitry 102 of FIG. 3 operates as a threshold device, only protecting the transistor Q1 when the base-emitter voltage $V_{bQ1}$ reaches a level large enough to energize the transistor Q2. It is therefore contemplated that alternative control circuitry could be designed in accordance with the present invention that is suitable for absorbing any reverse base current $I_{bQ1}$, thus providing greater protection to the transistor Q1. As described in further detail below, such alternative control circuitry is well suited for incorporating into the bias circuitry.

Figure 4:
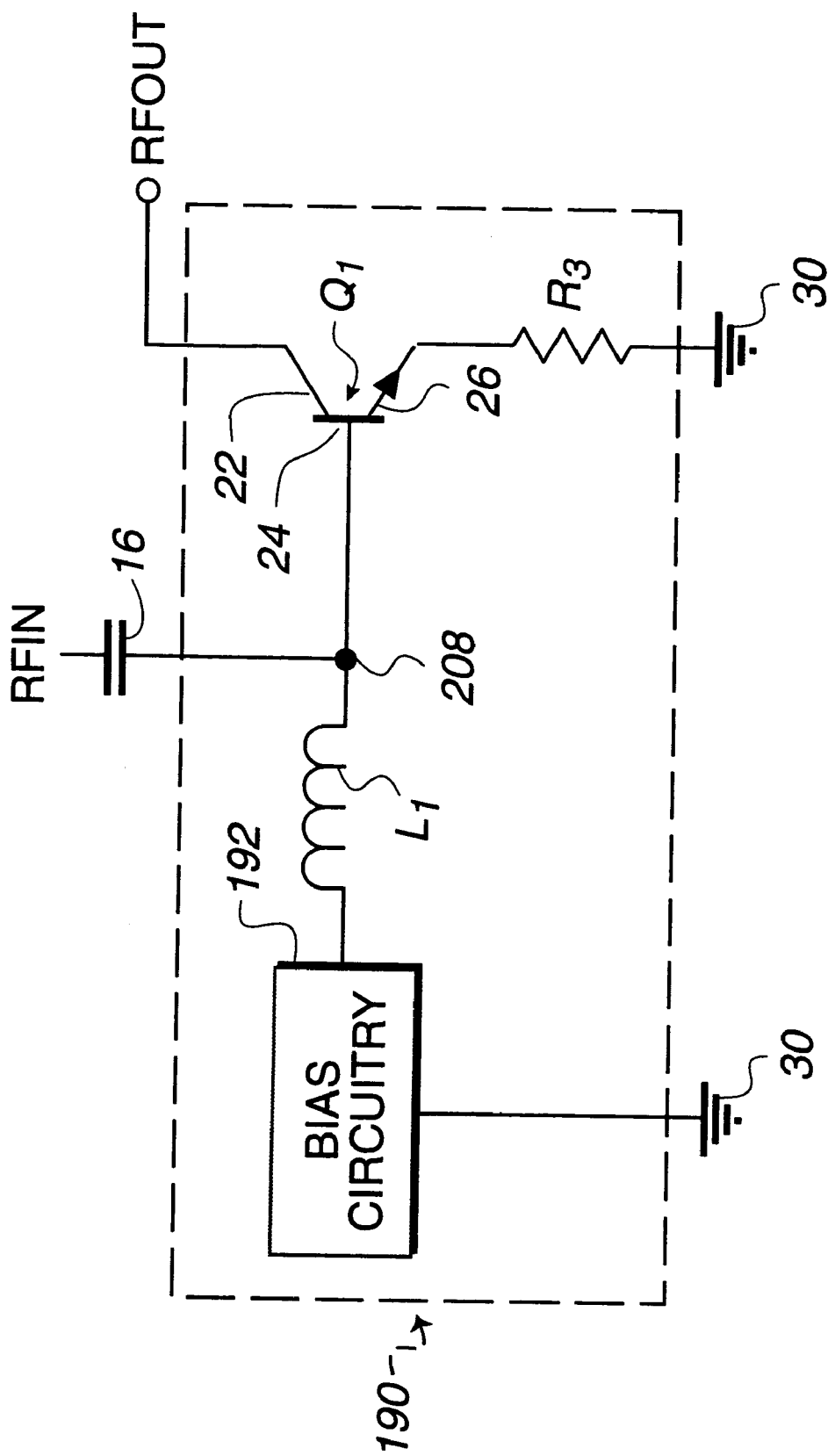
FIG. 4 is a schematic of an RF power amplifier output stage having bias circuitry in accordance with still another embodiment of the present invention.

With reference to FIG. 4, an output stage 190 in accordance with yet another embodiment of the present invention will now be described. The embodiment of FIG. 4 operates by incorporating feedback circuitry into the current biasing circuitry. The output stage 190 includes a power npn transistor Q1, bias circuitry 192, a buffer inductor L1 electrically coupling the base 24 and the bias circuitry 192, and a resistor $R_3$ coupling the emitter 26 to a common ground reference 30. FIG. 4 also shows the RFIN coupled to the base 24 of transistor Q1 by way of a capacitor 16. As mentioned earlier, the capacitor 16 eliminates the DC component of the RFIN signal.

Similar to bias circuitry of the prior art, one important purpose of the bias circuitry 192 is to provide a constant current to the power transistor Q1. This ensures that the power transistor Q1 is in a DC bias state (i.e., transistor Q1 is turned on) suitable for control by the AC component of the RFIN signal. However, unlike the prior art, the bias circuitry 192 is designed to control and absorb reverse base current $I_{bQ1}$ such as that which results during transistor breakdown of the transistor Q1.

The buffer inductor L1 prevents RF energy from being delivered to the bias circuitry 192. In preferred embodiments, the buffer inductor L1 has a low resistance such that it does not significantly alter the DC bias state. The buffer inductor L1 is an optional component that produces a more robust output stage, but is not essential to the present invention. The resistor $R_3$ is also an optional component, and serves a couple of well known uses. For example, the resistor $R_3$ limits $I_c$ current flow when reverse base current $I_{bQ1}$ exists.

Figure 5:
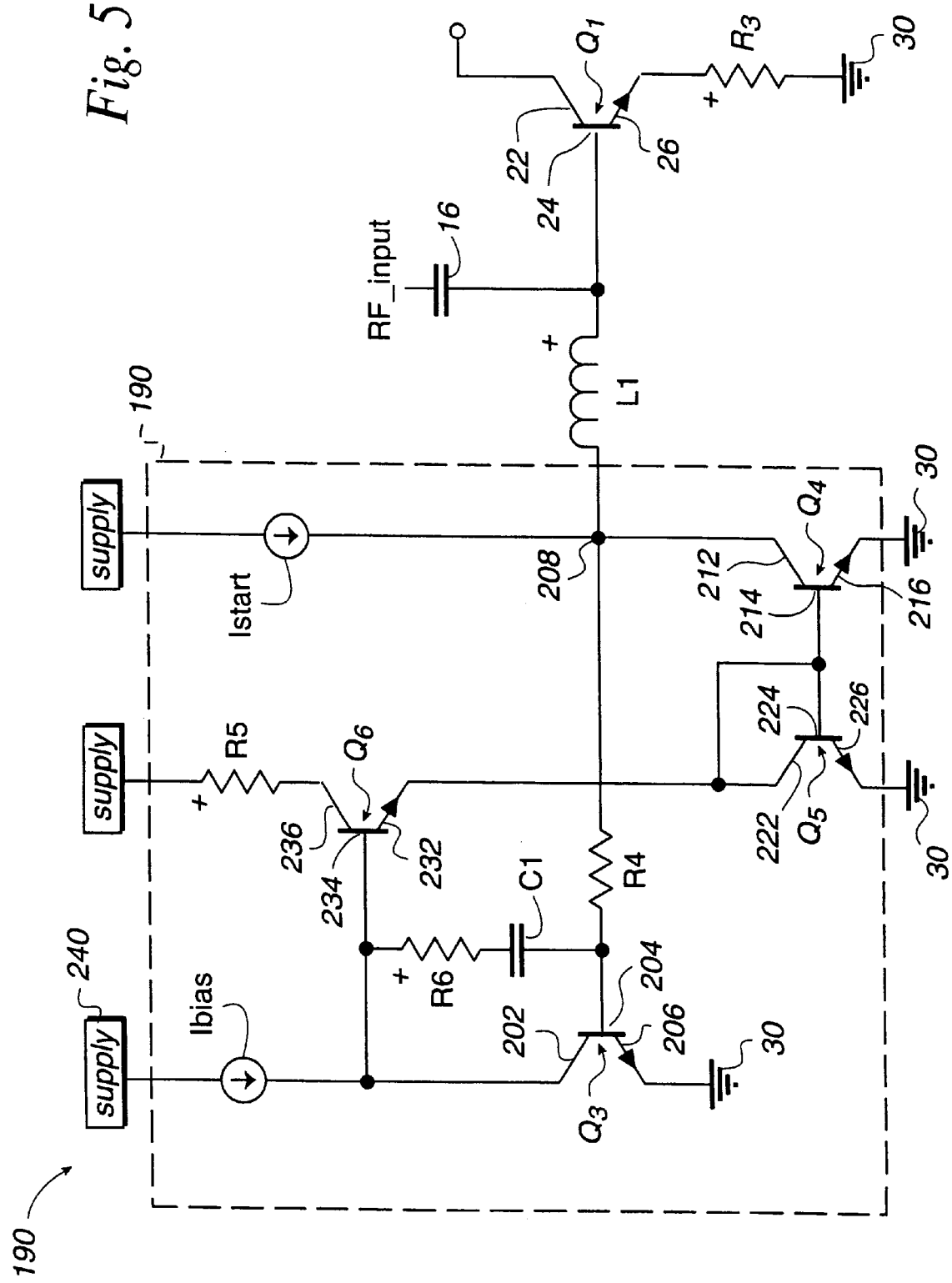
FIG. 5 is a schematic of an RF power amplifier output stage showing one preferred bias circuitry in accordance with the present invention.

Turning next to FIG. 5, one preferred embodiment of bias circuitry 192 of FIG. 4 will now be described. The specific bias circuitry 192 of FIG. 5 includes three npn transistors Q3, Q4, and Q5, a pnp transistor Q6, resistors $R_4$, $R_5$, and $R_6$, a capacitor C1, and two substantially constant current sources $I_{bias}$ and $I_{start}$. The transistors Q4, Q5, and Q6 each have a collector, a base, and an emitter as indicated by FIG. 5.

The substantially constant current source $I_{bias}$ has a first terminal coupled to a power supply 240 providing a substantially constant voltage, and a second terminal coupled to a node electrically connecting the base 234 of the transistor Q6, a first terminal of the resistor $R_6$, and the collector 202 of the transistor Q3. The emitter 206 of the transistor Q3 is coupled to ground 30.

The resistor $R_6$ and the capacitor C1 are coupled in series and electrically connect the base 234 of the transistor Q6 with the base 204 of the transistor Q3. As will be appreciated, the resistor $R_6$ and the capacitor C1 together form a compensation zero circuit. In brief, the compensation zero circuit tends to prevent oscillation of the bias circuitry 192 by reducing its gain at high frequencies.

The transistor $R_4$ couples the base 204 of the transistor Q3 to a startup node 208. The current source $I_{start}$ has a first terminal coupled to the power supply 240 and a second terminal coupled to the startup node 208. The inductor L1 couples the startup node 208 to the base 24 of the transistor Q1.

The resistor $R_5$ couples the power supply 240 to the emitter 236 of the pnp transistor Q6. The collector 232 of the pnp transistor Q6 is coupled to the current mirror formed by the transistor pair Q4 and Q5. The current mirror, specifically, the collector 212 of the transistor Q4, is coupled to the startup node 208.

In operation, only a very small amount of the current $I_{bias}$ will flow out of the base 234 of the transistor Q6, and in steady state none of the current $I_{bias}$ will flow through the charged capacitor C1. Thus, it can be assumed that all the current $I_{bias}$ is provided to the collector 202 of the transistor Q3.

The transistors Q1 and Q3 are coupled such that their operation together is similar to a current mirror. That is, for identical base-emitter voltages, the current flowing through Q1 will be related to the current flowing through Q3 by the step-up ratio of the two transistors. In preferred embodiments, the step-up ratio is about 10. Note that the resistor $R_3$ effects the base-emitter voltage of the transistor Q1. Accordingly, the resistor $R_4$ is included in the circuit to compensate for the voltage drop across $R_3$. For example, assume the step up ratio of Q1 to Q3 is 10, the beta current multiplier of Q1 is 100, and the value of $R_3$ is 2 ohms, then $R_4$ must be selected as 2000 ohms (10*100*2) in order to compensate for the voltage drop across $R_3$.

Operation of the output stage 190 is perhaps best further described by way of an example. Assume the output stage 190 is completely discharged when $I_{bias}$ is first turned on. Due to the current $I_{bias}$, the voltage at the base 234 of the transistor Q6 will increase until it reaches the value of the supply voltage 240 since no current is flowing in any of the elements of the output stage 190 at this point. When the voltage at the base 234 reaches the supply voltage 240, the pnp transistor Q6 is completely turned off.

With the transistor Q6 turned off, no current is flowing through the transistor Q5, and thus there is no current mirrored through transistor Q4. As a result, all of the current source $I_{start}$ is forced into base 24 and base 204, of transistors Q1 and Q3, respectively.

The current flow of $I_{start}$ raises the voltage at the startup node 208. The base current $I_b$ into Q3 is multiplied by the beta of Q3, causing collector current to begin flowing through Q3. As the collector current of Q3 absorbs the bias current $I_{bias}$, the base voltage of Q6 is drawn down. Drawing down the base voltage of Q6 turns Q6 on such that collector current begins to flow therethrough. The Q6 collector current flows through the collector of Q5, and is multiplied and mirrored through the transistor Q4. The collector current of the transistor Q4 is drawn out of the startup node 208, thus decreasing the current flowing into the bases of the transistors Q1 and Q3. Eventually, the Q3 collector current reaches equilibrium at approximately the entire bias current $I_{bias}$. In this equilibrium, the collector current through Q4 is just enough to absorb that portion of the current $I_{start}$ which is not needed for driving the transistors Q1 and Q3.

Thus the feedback provided in the bias circuit 192 tends to hold the DC bias current (or, alternatively, the DC base-emitter voltage) provided to the transistor Q1 at a constant value. Any change in the bias current or bias voltage results in a corresponding change in the current to be absorbed by the transistor Q4 out of the startup node 208.

Although only a few embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. An output stage suitable for use in a radio frequency (RF) power amplifier, the output stage comprising:

a first transistor having a base, a collector and an emitter, wherein a base-emitter voltage $V_{be}$ applied across the base and the emitter of the first transistor can control a collector current $I_{cQ1}$ flowing between the collector and the emitter of the first transistor, the collector current $I_{cQ1}$ being a function of a base current $I_{bQ1}$ flowing into the base of the first transistor; and control circuitry for electrically coupling the base of the first transistor to a common ground reference, the control circuitry including a variable impedance device, the control circuitry operable to sense the base-emitter voltage $V_{be}$ and adjust the impedance of the variable impedance device such that a portion of the base current $I_{bQ1}$ is adsorbed by the variable impedance device when the base-emitter voltage $V_{be}$ exceed a certain threshold voltage, whereby the control circuitry tends to prevent secondary breakdown of the first transistor by adsorbing the portion of the base current thereby limiting $I_{cQ1}$;

wherein the variable impedance device includes a second transistor having a collector, as base, and an emitter;

wherein the collector of the second transistor is coupled to the base of the first transistor, the base of the second transistor is driven by a signal related to the base-emitter voltage $V_{be}$, and the emitter of the second transistor is coupled to the common ground reference;

wherein the control circuitry further includes a pair of resistors $R_1$ and $R_2$ coupled in series between the base of the first transistor and the common around reference, and a node at which the resistors $R_1$ and $R_2$ are coupled providing at the base of the second transistor the signal having a voltage $(V_{be}*R_2(R_1+R_2)))$.

2. An output stage as recited in claim 1 wherein the first transistor and the control circuitry are formed within a single integrated circuit package.

3. An output stage as recited in claim 1 wherein the first transistor is a bipolar npn transistor.

4. An output stage as recited in claim 1 wherein the second transistor is a bipolar npn transistor.

5. An output stage as recited in claim 1 further including bias circuitry coupled to the base of the first transistor, the bias circuitry operable to bias the first transistor into an initial state such that an AC component of an RF signal provided at the base of the first transistor controls the collector current $I_c$.

6. An output stage as recited in claim 5 further including a buffer inductor, the buffer inductor serving as the coupling between the bias circuitry and the base of the first transistor thereby tending to prevent the AC component of the RF signal flowing into the bias circuitry.

7. An output stage as recited in claim 1 wherein the output stage is a power amplifier for a communications system.

8. An output stage as recited in claim 7 wherein the communications system is a cellular phone system.

9. An output stage as recited in claim 7 wherein the communication system is a paging system.

10. An output stage as recited in claim 7 wherein the communication system is a cordless phone system.

11. An output stage as recited in claim 1 wherein the output stage is a driver amplifier component of a communication system.

12. A data communication system comprising:

an output stage including:

a first transistor having a base, a collector and an emitter, wherein a base-emitter voltage $V_{be}$ applied across the base and the emitter of the first transistor can control a collector current $I_{cQ1}$ flowing between the collector and the emitter of the first transistor, the collector current $I_{cQ1}$ being a function of a base current $I_{bQ1}$ flowing into the base of the first transistor; and control circuitry for electrically couple the base of first transistor to a common ground reference, the control circuitry including a variable impedance device, the control circuitry operable to sense the base-emitter voltage $V_{be}$ and adjust the impedance of the variable impedance device such that a portion of the base current $I_{bQ1}$ is adsorbed by the variable impedance device when the base-emitter voltage $V_{be}$ exceeds a certain threshold voltage; and an antenna coupled to the collector of the first transistor, whereby the control circuitry tends to prevent secondary breakdown of the first transistor by absorbing the portion of the base current thereby limiting $I_{cQ1}$;

wherein the variable impedance device includes a second transistor having a collector, a base and an emitter;, wherein the collector of the second transistor is coupled to the base of the first transistor, the base of the second transistor is coupled to a specific node providing a signal related to the base-emitter voltage $V_{be}$, and the emitter of the second transistor is coupled to the common ground reference;

wherein the control circuitry further includes a pair of resistors $R_1$ and $R_2$ coupled in series between the base of the first resistor $Q_1$ and the common ground reference, the resistor $R_1$ and $R_2$ coupled together at the specific node, whereby a voltage at the base of the transistor $Q_2$ has a Value equal to the base-emitter voltage $V_{be}*R_2/(R_1+R_2)$.

13. A data communication system as recited in claim 12 wherein the first transistor and the control circuitry are formed within a single integrated circuit package.

14. A data communication system as recited in claim 12 wherein the first transistor is a bipolar npn transistor.

15. A data communication system as recited in claim 12 wherein the second transistor is a bipolar npn transistor.

16. A data communication system as recited in claim 12 further including bias circuitry coupled to the base of the first transistor, the bias circuitry operable to bias the first transistor into an initial state such that an AC component of an RF signal provided at the base of the first transistor controls the collector current $I_c$.

17. A data communication system as recited in claim 12, wherein the data communication system is a radio frequency (RF) communication system.

18. A data communication system as recited in claim 17 wherein the data communication system is a cellular phone.

19. A data communication system as recited in claim 17 wherein the data communication system is a cordless phone.

20. A method for protecting an output stage from secondary transistor breakdown under high voltage standing wave ratio (VSWR) operating conditions, the output stage comprising a bipolar power first transistor including a collector, a base, and an emitter, the method comprising the acts of:

sensing a base-emitter voltage $V_{be}$; and absorbing a portion of a base current $I_b$ driving the base of the first transistor in response to the base-emitter voltage $V_{be}$, thereby decreasing the quantity of the base current $I_b$ driving the base of the first transistor, whereby a collector current $I_c$ flowing through the first transistor that is a function of the base current $I_b$ is decreased due to the decrease in the base current $I_b$ driving the first transistor;

wherein the act of adsorbing a portion of a base current $I_b$ includes the act of decreasing an impedance of a variable impedance device coupled between the base of the first transistor and a common ground reference;

wherein the variable impedance device is a second transistor having a collector, a base and an emitter;

wherein the act of sensing the base-emitter voltage $V_{be}$ of the first transistor is accomplished by coupling a pair of resistors $R_1$ and $R_2$ in series between the base of the first transistor and the common ground reference, the two resistors $R_1$ and $R_2$ being coupled at the base of the second transistor.

21. A method as recited in claim 20 wherein the act of absorbing a portion of the base current $I_b$ is a threshold action only absorbing the portion of the base current $I_b$ when the base-emitter voltage $V_{be}$ is greater than or equal to a certain voltage.

22. A method as recited in claim 20 further comprising the act of providing a bias signal to the base of the first transistor in order to bias the first transistor into an initial state such that an AC component of an RF signal provided at the base of the first transistor controls the collector current $I_c$.

* * * * *

UNITED STATES PATENT AND TRADEMARK OFFICE
CERTIFICATE OF CORRECTION

PATENT NO. : 6,137,366 B1
DATED : March 26, 2001
INVENTOR(S) : Joel R. King

It is certified that error appears in the above-identified patent and that said Letters Patent is hereby corrected as shown below:

Column 7,
Line 21, please replace "adsorbing" with -- absorbing -- .
Line 33, please replace "around" with -- ground -- as filed in the amendment dated April 18, 2000.

Signed and Sealed this

Sixth Day of November, 2001

Attest:

*Nicholas P. Godici*

NICHOLAS P. GODICI
*Attesting Officer*    *Acting Director of the United States Patent and Trademark Office*